United States Patent [19]

Oshikiri et al.

[11] E Patent Number: Re. 33,301

[45] Reissued Date of Patent: Aug. 14, 1990

[54] SYNCHRONISM DETECTOR CIRCUIT

[75] Inventors: Keiichi Oshikiri; Tooru Nakamura, both of Hyogo, Japan

[73] Assignee: Mitsubishi Denki Kabushiki Kaisha, Tokyo, Japan

[21] Appl. No.: 370,322

[22] Filed: Jun. 22, 1989

Related U.S. Patent Documents

Reissue of:

[64] Patent No.: 4,678,949
Issued: Jul. 7, 1987
Appl. No.: 760,540
Filed: Jul. 30, 1985

[30] Foreign Application Priority Data

Nov. 15, 1984 [JP] Japan ..... 59-239428

[51] Int. Cl.[5] ..... H03K 5/26
[52] U.S. Cl. ..... 307/527; 328/133
[58] Field of Search ..... 328/133, 134; 307/525, 307/526, 527

[56] References Cited

U.S. PATENT DOCUMENTS

| | | | |
|---|---|---|---|
| 3,233,180 | 2/1966 | Eddy | 328/134 |
| 3,327,226 | 6/1967 | Nourney | 307/527 |
| 3,441,342 | 4/1969 | Ball et al. | 328/134 |
| 3,798,556 | 3/1974 | Ooya et al. | 328/133 |
| 3,805,153 | 4/1974 | Gallant | 328/133 |

OTHER PUBLICATIONS

Shiro Doi et al, Journal OHM for Jun. 1983, pp. 20–23, "Uninterruptible Power Supply (CVCF) System & Influence Countermeasure".

*Primary Examiner*—John S. Heyman
*Attorney, Agent, or Firm*—Bernard, Rothwell & Brown

[57] ABSTRACT

A synchronism detector circuit wherein it is arranged so that two a.c. voltages the synchronism of which is to be determined are converted, respectively, into rectangular pulses, which pulses trigger a pair of one-shot multivibrators, respectively, the logical product of the outputs from these one-shot multivibrators is provided, and the thus provided logical product causes signals indicating the states of synchronism between the a.c. voltages to be output.

4 Claims, 2 Drawing Sheets

VOLTAGE OF INVERTER (1)

VOLTAGE OF COMMERCIAL POWER SOURCE (2)

OUTPUT OF COMPARATOR (8a)

OUTPUT OF COMPARATOR (8b)

OUTPUT OF ONE-SHOT MULTIVIBRATOR (9a)

OUTPUT OF ONE-SHOT MULTIVIBRATOR (9b)

OUTPUT OF AND CIRCUIT (10)

OUTPUT OF ONE SHOT MULTIVIBRATOR (11)

SYNCHRONISM DETECTOR CIRCUIT

Matter enclosed in heavy brackets [ ] appears in the original patent but forms no part of this reissue specification; matter printed in italics indicates the additions made by reissue.

BACKGROUND OF THE INVENTION

1. Field of the Invention

The present invention relates to a synchronism detector circuit and more particularly to a synchronism detector circuit for deciding about states of synchronism between two a.c. voltages, from, for example, an uninterruptible power system (hereinafter to be referred to as CVCF) and the commercial power source.

2. Description of the Prior Art

As a synchronism detector circuit of this kind, the one as shown in FIG. 1 has so far been proposed. Referring to the drawing, numeral reference 1 denotes an inverter used as a CVCF, 2 denotes a commercial power source, and 3 denotes a differential amplifier for amplifying voltage difference between the inverter 1 and the commercial power source 2, the differential amplifier constituted of resistors 4a, 4b, 4c and an operational amplifier 5. Numeral references 6a, 6b denote comparators for comparing a standard signal Vf which provides a detection level with the signal output from the differential amplifier 3 to these comparators 6a and 6b, and 7 denotes an AND circuit for making AND operation for the output signals from the comparators 6a and 6b.

Operation of the circuit in FIG. 1 will be described below. The voltages from the inverter 1 and the commercial power source 2 both having a sinusoidal waveform are input to the differential amplifier 3 for detection of the voltage difference therebetween. When the inverter 1 and the commercial power source 2 are in synchronism, the voltages of the same are equal in amplitude and are in phase. Hence, the level of the output signal from the differential amplifier 3 becomes approximately 0 volt. When, on the other hand, the inverter 1 and the commercial power source 2 are not in synchronism, the output signal from the differential amplifier 3 does not become 0 volt, but becomes ± several volts. Such an output signal from the differential amplifier 3 and the reference signal Vf, which is for providing a detection allowance, are compared in the comparators 6a, 6b. When the former is larger than Vf, or smaller than Vf, the output of the comparator 6a or 6b becomes L0, and therefore, the output of the AND circuit 7 becomes L0. The L0 state of the output of the AND circuit indicates that the inverter 1 and the commercial power source 2 are in a synchronism.

If a case of switching from the commercial power source to the CVCF is considered, the voltage of the CVCF should be leading by some degrees, in general, because the power source impedance of the CVCF is larger than that of the commercial power source. Therefore, even in such a condition, the state of synchronism should be decided to be "in synchronism" by the detector circuit. However, the prior art synchronism detector circuit had a disadvantage, because of its structure as described above, that it was unable to independently provide both the voltages with different synchronism detection allowances.

SUMMARY OF THE INVENTION

The primary object of the present invention is to provide a synchronism detector circuit overcoming the above described disadvantage of the prior art device and effective in deciding about the state of synchronism between two a.c. voltages.

Another object of the invention is to provide a synchronism detector circuit capable of setting up at will the synchronism detection allowances independently for the commercial power source and for a CVCF power source.

Other objects and advantages of the invention will be made more apparent by the detailed description of the preferred embodiment to be given below with reference to the accompanying drawings.

DESCRIPTION OF THE PREFERRED EMBODIMENT

Figure 1:
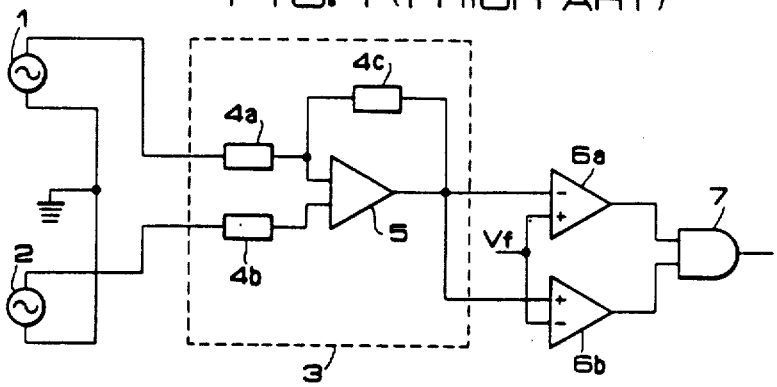
FIG. 1 (PRIOR ART)
FIG. 1 is a circuit diagram showing a prior art synchronism detector circuit.
Figure 2:
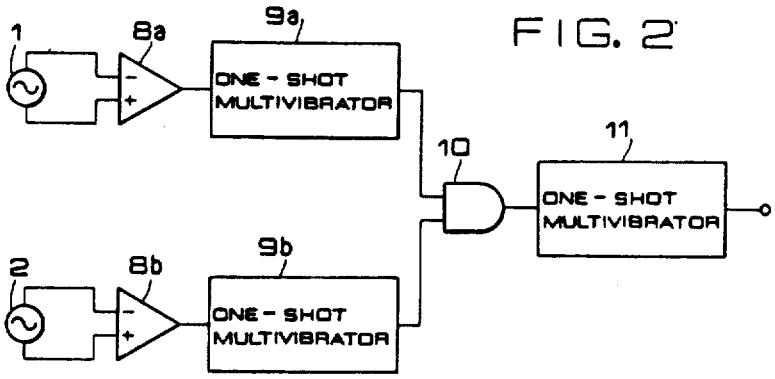
FIG. 2 is a circuit diagram showing a synchronism detector circuit of a preferred embodiment of the invention.

FIG. 2 is a circuit diagram showing a preferred embodiment of the invention, in which numeral references 8a, 8b denote comparators for detecting zero cross points of the voltages (of sinusoidal form) of the inverter 1 and the commercial power source 2, 9a, 9b denote one-shot multivibrators triggered by a change in the logical level of the output from the comparators 8a, 8b for providing pulses whose widths are Ifa, Ifb corresponding to synchronism detection allowance. Numeral reference 10 denotes an AND circuit, and 11 denotes a retriggerable one-shot multivibrator which is triggered by the output of the AND circuit 10 and outputs a synchronous signal continuing for more than one cycle of both A.C. signals.

Figures 3A, 3B, 3C, 3D, 3E, 3F, 3G, 3H:
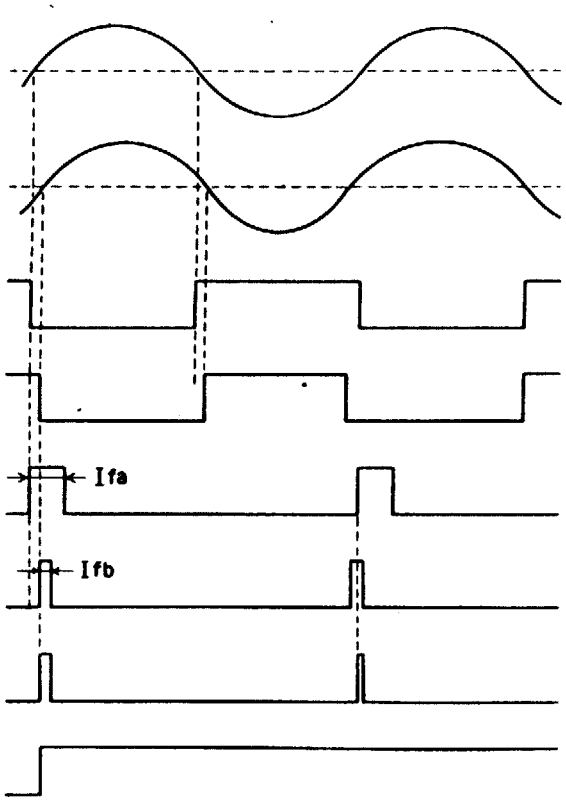
FIG. 3 is an operational waveform diagram of the synchronism detector circuit as shown in FIG. 2.

Operation of the embodiment in FIG. 2 will be described in the following with reference to the waveform diagram of FIG. 3. The voltages of the inverter 1 and the commercial power source 2 [FIG. 3, (a) and (b)] are input to the comparators 8a, 8b and converted therein into rectangular pulse outputs in which HI or L0 logical level is changed to L0 or HI logical level at the zero-cross point [FIG. 3 (c) and (d)]. The one-shot multivibrators 9a, 9b are adapted to be triggered only when the outputs of the comparators 8a, 8b are changed from HI level to L0 level and provide pulses whose pulse widths are Ifa, Ifb. Consequently, if the phase of the voltage on the inverter 1 side is taken as the reference, the output of the AND circuit 10 is provided with HI level thereby to trigger the one-shot multivibrator 11 even if the phase of the commercial power source 2 is delayed within the range of Ifa. Thus, the output of the same is held HI thereby to indicate that the inverter 1 and the commercial power source 2 are in synchronism. On the other hand, if the pulse of the voltage of the commercial power source 2 is taken as the reference, the one-shot multivibrator 11 will alike be triggered and indicate, even if the phase of the voltage of the inverter 1 is delayed within the duration of the pulse width Ifb, that both the voltages are in synchronism. In this way, the synchronous condition is detected both within the range of the pulse width Ifa for the leading side of the voltage of the inverter 1 from the voltage of the commercial power source 2 and within the range of the pulse width Ifb for the lagging side of the inverter 1 from the commercial power source 2, and therefore, it has been made possible to provide different synchronism detection allowances individually for the leading side and the lagging side by changing respective pulse widths.

While the case where different synchronous detection allowances are set up for the leading side and the lagging side of the CVCF from the commercial power source was mentioned in the above described embodiment, the synchronism detection allowances may be of the same magnitudes for leading and lagging sides in such a case as to detect synchronism between the voltage of a common bus-line to which a plurality of CVCF units in parallel operation are connected and the voltage of the individual CVCF units.

According to the present invention as described so far, the monostable multivibrator is provided for each of the CVCF side and the commercial power side, and therefore, the synchronism detection allowances can be independently set up for respective sides if the allowances should be different. Thus, the effect is obtained that highly accurate synchronism detection can be performed.

What is claimed is:

1. A synchronism detector circuit for indicating a state of synchronism between two a.c. voltages comprising:

first and second comparators for detecting zero cross points of said two a.c. voltages, respectively;

first and second one-shot multivibrators triggered by outputs from said first and second comparators, respectively, for providing pulses having the pulse widths set up in correspondence with the respective synchronous detection allowances;

an AND circuit for providing the logical product of the outputs from said one-shot multivibrators; and a third retriggerable one shot multivibrator triggered by the output from said AND circuit and maintaining an altered state so long as there is relative synchronism between said a.c. voltages as determined by the tolerance allowances of said first and second one-shot multivibrators.

2. A synchronism detector circuit according to claim 1, wherein said two a.c. voltages are of an uninterruptable power system (CVCF) and a commercial power source.

3. A synchronism detector circuit according to claim 1, wherein the pulse widths output from said first and second one-shot multivibrators are of the same magnitudes.

4. A synchronism detector circuit according to claim 1 wherein the pulse widths output from said first and second one-shot multivibrators are of different magnitudes.

* * * * *